(12) United States Patent
Telefus

(10) Patent No.: US 11,056,981 B2
(45) Date of Patent: Jul. 6, 2021

(54) METHOD AND APPARATUS FOR SIGNAL EXTRACTION WITH SAMPLE AND HOLD AND RELEASE

(71) Applicant: INTELESOL, LLC, Danville, CA (US)

(72) Inventor: Mark Telefus, Orinda, CA (US)

(73) Assignee: Intelesol, LLC, Danville, CA (US)

( * ) Notice: Subject to any disclaimer, the term of this patent is extended or adjusted under 35 U.S.C. 154(b) by 0 days.

(21) Appl. No.: 16/029,546

(22) Filed: Jul. 7, 2018

(65) Prior Publication Data

US 2020/0014301 A1 Jan. 9, 2020

(51) Int. Cl.
*H02M 7/217* (2006.01)
*G11C 27/02* (2006.01)
*H02M 7/219* (2006.01)

(52) U.S. Cl.
CPC ........... *H02M 7/217* (2013.01); *G11C 27/024* (2013.01); *G11C 27/026* (2013.01); *H02M 2007/2195* (2013.01)

(58) Field of Classification Search
CPC ........ G11C 27/026; H02M 2007/2195; H02M 3/33507; H02M 2001/0009; H02M 2001/0025; H02M 1/10; H02M 2001/003; H02M 2001/0083; H02M 1/42; H02M 1/4258; H02M 2001/4283; H02M 7/02; H02M 7/04; H02M 7/06; H02M 7/155; (Continued)

(56) References Cited

U.S. PATENT DOCUMENTS

| 3,638,102 A | 1/1972 | Pelka |
| 3,777,253 A | 12/1973 | Callan |
| 4,074,345 A | 2/1978 | Ackermann |

(Continued)

FOREIGN PATENT DOCUMENTS

| EP | 0016646 A1 | 10/1980 |
| EP | 0398026 A2 | 11/1990 |

(Continued)

OTHER PUBLICATIONS

Patent Cooperation Treaty, "International Preliminary Report on Patentability," Issued in counterpart PCT application PCT/US2019/040883, dated Jan. 12, 2021, 5 pages.

(Continued)

*Primary Examiner* — Gustavo A Rosario-Benitez
(74) *Attorney, Agent, or Firm* — Ryan, Mason & Lewis, LLP

(57) ABSTRACT

For AC-DC conversion, signal is extracted, then sampled and held and released. Extraction element receives AC signal to generate extracted signal, then sample and hold and release element receives the extracted signal to generate DC signal. Extraction and/or sample and hold and release signal processing may use microprocessor or controller programmably to generate the extracted signal and/or DC signal. Extraction is configurable such that AC signal is received at extraction time or temporal window, whereby said extraction element generates the extracted signal having an extraction current or voltage value during at least one extraction time, and preferably said sample and hold and release element generates the DC signal having the same extraction current or voltage value.

12 Claims, 3 Drawing Sheets

(58) Field of Classification Search
CPC ........ H02M 7/162; H02M 7/217; H02M 7/21; H02M 7/219; H02M 7/2176
See application file for complete search history.

(56) References Cited

U.S. PATENT DOCUMENTS

| | | | |
|---|---|---|---|
| 4,127,895 A | 11/1978 | Krueger |
| 4,245,148 A | 1/1981 | Gisske et al. |
| 4,245,184 A | 1/1981 | Billings et al. |
| 4,245,185 A | 1/1981 | Mitchell et al. |
| 4,257,081 A | 3/1981 | Sauer et al. |
| 4,466,071 A | 8/1984 | Russell, Jr. |
| 4,487,458 A | 12/1984 | Janutka |
| 4,581,540 A | 4/1986 | Guajardo |
| 4,631,625 A | 12/1986 | Alexander et al. |
| 4,636,907 A | 1/1987 | Howell |
| 4,649,302 A | 3/1987 | Damiano et al. |
| 4,653,084 A | 3/1987 | Ahuja |
| 4,682,061 A | 7/1987 | Donovan |
| 4,685,046 A | 8/1987 | Sanders |
| 4,709,296 A | 11/1987 | Hung et al. |
| 4,760,293 A | 7/1988 | Hebenstreit |
| 4,766,281 A | 8/1988 | Buhler |
| 4,812,995 A | 3/1989 | Girgis et al. |
| 4,888,504 A | 12/1989 | Kinzer |
| 5,121,282 A | 6/1992 | White |
| 5,276,737 A | 1/1994 | Micali |
| 5,307,257 A | 4/1994 | Fukushima |
| 5,371,646 A | 12/1994 | Biegelmeier |
| 5,410,745 A | 4/1995 | Friesen et al. |
| 5,559,656 A | 9/1996 | Chokhawala |
| 5,646,514 A | 7/1997 | Tsunetsugu |
| 5,654,880 A | 8/1997 | Brkovic et al. |
| 5,731,732 A | 3/1998 | Williams |
| 5,793,596 A | 8/1998 | Jordan et al. |
| 5,796,274 A | 8/1998 | Willis et al. |
| 5,870,009 A | 2/1999 | Serpinet et al. |
| 5,933,305 A | 8/1999 | Schmalz et al. |
| 6,081,123 A | 6/2000 | Kasbarian et al. |
| 6,111,494 A | 8/2000 | Fischer et al. |
| 6,115,267 A | 9/2000 | Herbert |
| 6,141,197 A | 10/2000 | Kim et al. |
| 6,160,689 A | 12/2000 | Stolzenberg |
| 6,167,329 A | 12/2000 | Engel et al. |
| 6,169,391 B1 | 1/2001 | Lei |
| 6,188,203 B1 | 2/2001 | Rice et al. |
| 6,300,748 B1 | 10/2001 | Miller |
| 6,369,554 B1 | 4/2002 | Aram |
| 6,483,290 B1 | 11/2002 | Hemminger et al. |
| 6,515,434 B1 | 2/2003 | Biebl |
| 6,538,906 B1 | 3/2003 | Ke et al. |
| 6,756,998 B1 | 6/2004 | Bilger |
| 6,788,512 B2 | 9/2004 | Vicente et al. |
| 6,813,720 B2 | 11/2004 | Leblanc |
| 6,839,208 B2 | 1/2005 | Macbeth et al. |
| 6,843,680 B2 | 1/2005 | Gorman |
| 6,906,476 B1 | 6/2005 | Beatenbough et al. |
| 6,984,988 B2 | 1/2006 | Yamamoto |
| 7,045,723 B1 | 5/2006 | Projkovski |
| 7,053,626 B2 | 5/2006 | Monter et al. |
| 7,110,225 B1 | 9/2006 | Hick |
| 7,164,238 B2 | 1/2007 | Kazanov et al. |
| 7,297,603 B2 | 11/2007 | Robb et al. |
| 7,304,828 B1 | 12/2007 | Shvartsman |
| D558,683 S | 1/2008 | Pape et al. |
| 7,319,574 B2 | 1/2008 | Engel |
| D568,253 S | 5/2008 | Gorman |
| 7,367,121 B1 | 5/2008 | Gorman |
| 7,586,285 B2 | 9/2009 | Gunji |
| 7,595,680 B2 | 9/2009 | Morita et al. |
| 7,610,616 B2 | 10/2009 | Masuouka et al. |
| 7,633,727 B2 | 12/2009 | Zhou et al. |
| 7,643,256 B2 | 1/2010 | Wright et al. |
| 7,693,670 B2 | 4/2010 | Durling et al. |
| 7,715,216 B2 | 5/2010 | Liu et al. |
| 7,729,147 B1 | 6/2010 | Wong et al. |
| 7,731,403 B2 | 6/2010 | Lynam et al. |
| 7,746,677 B2 | 6/2010 | Unkrich |
| 7,821,023 B2 | 10/2010 | Yuan et al. |
| D638,355 S | 5/2011 | Chen |
| 7,936,279 B2 | 5/2011 | Tang et al. |
| 7,948,719 B2 | 5/2011 | Xu |
| 8,124,888 B2 | 2/2012 | Etemad-Moghadam et al. |
| 8,256,675 B2 * | 9/2012 | Baglin ................. H02M 7/219 235/451 |
| 8,374,729 B2 | 2/2013 | Chapel et al. |
| 8,463,453 B2 | 6/2013 | Parsons, Jr. |
| 8,482,885 B2 | 7/2013 | Billingsley et al. |
| 8,560,134 B1 | 10/2013 | Lee |
| 8,649,883 B2 | 2/2014 | Lu et al. |
| 8,664,886 B2 | 3/2014 | Ostrovsky |
| 8,717,720 B2 | 5/2014 | DeBoer |
| 8,718,830 B2 | 5/2014 | Smith |
| 8,781,637 B2 | 7/2014 | Eaves |
| 8,817,441 B2 | 8/2014 | Callanan |
| 8,890,371 B2 | 11/2014 | Gotou |
| D720,295 S | 12/2014 | Dodal et al. |
| 8,947,838 B2 | 2/2015 | Yamai et al. |
| 9,054,587 B2 | 6/2015 | Neyman |
| 9,055,641 B2 | 6/2015 | Shteynberg et al. |
| 9,287,792 B2 | 3/2016 | Telefus et al. |
| 9,325,516 B2 | 4/2016 | Pera et al. |
| 9,366,702 B2 | 6/2016 | Steele et al. |
| 9,439,318 B2 | 9/2016 | Chen |
| 9,443,845 B1 | 9/2016 | Stafanov et al. |
| 9,502,832 B1 | 11/2016 | Ullahkhan et al. |
| 9,509,083 B2 | 11/2016 | Yang |
| 9,515,560 B1 * | 12/2016 | Telefus ................. H02M 3/158 |
| 9,577,420 B2 | 2/2017 | Ostrovsky et al. |
| 9,621,053 B1 | 4/2017 | Telefus |
| 9,774,182 B2 | 9/2017 | Phillips |
| 9,836,243 B1 | 12/2017 | Chanler et al. |
| D814,424 S | 4/2018 | DeCosta |
| 9,965,007 B2 | 5/2018 | Amelio et al. |
| 9,990,786 B1 | 6/2018 | Ziraknejad |
| 9,991,633 B2 | 6/2018 | Robinet |
| 10,072,942 B2 | 9/2018 | Wootton et al. |
| 10,101,716 B2 | 10/2018 | Kim |
| 10,187,944 B2 | 1/2019 | MacAdam et al. |
| 10,469,077 B2 | 11/2019 | Telefus et al. |
| D879,056 S | 3/2020 | Telefus |
| D881,144 S | 4/2020 | Telefus |
| 10,615,713 B2 | 4/2020 | Telefus et al. |
| 10,645,536 B1 | 5/2020 | Barnes et al. |
| 10,756,662 B2 | 8/2020 | Steiner et al. |
| 10,812,072 B2 | 10/2020 | Telefus et al. |
| 10,812,282 B2 | 10/2020 | Telefus et al. |
| 10,819,336 B2 | 10/2020 | Telefus et al. |
| 10,834,792 B2 | 11/2020 | Telefus et al. |
| 2002/0109487 A1 * | 8/2002 | Telefus ................. H02M 1/10 323/239 |
| 2003/0052544 A1 | 3/2003 | Yamamoto et al. |
| 2003/0063420 A1 | 4/2003 | Pahl et al. |
| 2003/0151865 A1 | 8/2003 | Maio |
| 2004/0032756 A1 | 2/2004 | Van Den Bossche |
| 2004/0251884 A1 | 12/2004 | Steffie et al. |
| 2005/0162139 A1 | 7/2005 | Hirst |
| 2005/0185353 A1 | 8/2005 | Rasmussen et al. |
| 2005/0286184 A1 | 12/2005 | Campolo |
| 2006/0285366 A1 | 12/2006 | Radecker et al. |
| 2007/0008747 A1 | 1/2007 | Soldano et al. |
| 2007/0143826 A1 | 6/2007 | Sastry et al. |
| 2007/0159745 A1 | 7/2007 | Berberich et al. |
| 2007/0188025 A1 | 8/2007 | Keagy et al. |
| 2007/0236152 A1 | 10/2007 | Davis et al. |
| 2008/0136581 A1 | 6/2008 | Heilman et al. |
| 2008/0151444 A1 | 6/2008 | Upton |
| 2008/0174922 A1 | 7/2008 | Kimbrough |
| 2008/0180866 A1 | 7/2008 | Wong |
| 2008/0204950 A1 | 8/2008 | Zhou et al. |
| 2008/0253153 A1 | 10/2008 | Wu et al. |
| 2008/0281472 A1 | 11/2008 | Podgorny et al. |
| 2009/0034139 A1 | 2/2009 | Martin |

(56) References Cited

U.S. PATENT DOCUMENTS

| | | | |
|---|---|---|---|
| 2009/0067201 A1* | 3/2009 | Cai | H02M 3/33523 363/21.12 |
| 2009/0168273 A1 | 7/2009 | Yu et al. | |
| 2009/0203355 A1 | 8/2009 | Clark | |
| 2009/0213629 A1* | 8/2009 | Liu | H02M 3/155 363/89 |
| 2009/0284385 A1 | 11/2009 | Tang et al. | |
| 2010/0091418 A1 | 4/2010 | Xu | |
| 2010/0145479 A1 | 6/2010 | Griffiths | |
| 2010/0156369 A1 | 6/2010 | Kularatna et al. | |
| 2010/0188054 A1 | 7/2010 | Asakura et al. | |
| 2010/0231135 A1 | 9/2010 | Hum et al. | |
| 2010/0231373 A1 | 9/2010 | Romp | |
| 2010/0244730 A1 | 9/2010 | Nerone | |
| 2010/0261373 A1 | 10/2010 | Roneker | |
| 2010/0284207 A1 | 11/2010 | Watanabe et al. | |
| 2010/0320840 A1 | 12/2010 | Fridberg | |
| 2011/0062936 A1 | 3/2011 | Bartelous | |
| 2011/0121752 A1 | 5/2011 | Newman, Jr. et al. | |
| 2011/0127922 A1 | 6/2011 | Sauerlaender | |
| 2011/0156610 A1 | 6/2011 | Ostrovsky et al. | |
| 2011/0273103 A1 | 11/2011 | Hong | |
| 2011/0292703 A1 | 12/2011 | Cuk | |
| 2011/0301894 A1 | 12/2011 | Sanderford, Jr. | |
| 2011/0305054 A1 | 12/2011 | Yamagiwa et al. | |
| 2011/0307447 A1 | 12/2011 | Sabaa et al. | |
| 2012/0026632 A1 | 2/2012 | Acharya et al. | |
| 2012/0075897 A1* | 3/2012 | Fujita | H02M 7/217 363/127 |
| 2012/0089266 A1 | 4/2012 | Tomimbang et al. | |
| 2012/0095605 A1 | 4/2012 | Tran | |
| 2012/0133289 A1 | 5/2012 | Hum et al. | |
| 2012/0275076 A1 | 11/2012 | Shono | |
| 2012/0311035 A1 | 12/2012 | Guha et al. | |
| 2013/0051102 A1 | 2/2013 | Huang et al. | |
| 2013/0057247 A1 | 3/2013 | Russell et al. | |
| 2013/0063851 A1 | 3/2013 | Stevens et al. | |
| 2013/0066478 A1 | 3/2013 | Smith | |
| 2013/0088160 A1 | 4/2013 | Chai et al. | |
| 2013/0119958 A1 | 5/2013 | Gasperi | |
| 2013/0128396 A1 | 5/2013 | Danesh et al. | |
| 2013/0170261 A1* | 7/2013 | Lee | H02H 7/16 363/126 |
| 2013/0174211 A1 | 7/2013 | Aad et al. | |
| 2013/0253898 A1 | 9/2013 | Meagher et al. | |
| 2013/0261821 A1 | 10/2013 | Lu et al. | |
| 2013/0300534 A1 | 11/2013 | Myllymaki | |
| 2013/0329331 A1 | 12/2013 | Erger et al. | |
| 2014/0043732 A1 | 2/2014 | McKay et al. | |
| 2014/0067137 A1 | 3/2014 | Amelio et al. | |
| 2014/0074730 A1 | 3/2014 | Arensmeier et al. | |
| 2014/0085940 A1 | 3/2014 | Lee et al. | |
| 2014/0096272 A1 | 4/2014 | Makofsky et al. | |
| 2014/0097809 A1 | 4/2014 | Follic et al. | |
| 2014/0159593 A1 | 6/2014 | Chu et al. | |
| 2014/0203718 A1 | 7/2014 | Yoon et al. | |
| 2014/0246926 A1 | 9/2014 | Cruz et al. | |
| 2014/0266698 A1 | 9/2014 | Hall et al. | |
| 2014/0268935 A1* | 9/2014 | Chiang | H02M 1/36 363/49 |
| 2014/0276753 A1 | 9/2014 | Wham et al. | |
| 2015/0042274 A1 | 2/2015 | Kim et al. | |
| 2015/0055261 A1 | 2/2015 | Lubicki et al. | |
| 2015/0097430 A1 | 4/2015 | Scruggs | |
| 2015/0154404 A1 | 6/2015 | Patel et al. | |
| 2015/0155789 A1 | 6/2015 | Freeman et al. | |
| 2015/0180469 A1 | 6/2015 | Kim | |
| 2015/0216006 A1 | 7/2015 | Lee et al. | |
| 2015/0236587 A1 | 8/2015 | Kim et al. | |
| 2015/0256355 A1 | 9/2015 | Pera et al. | |
| 2015/0256665 A1 | 9/2015 | Pera et al. | |
| 2015/0282223 A1 | 10/2015 | Wang et al. | |
| 2015/0309521 A1 | 10/2015 | Pan | |
| 2015/0317326 A1 | 11/2015 | Bandurapalli et al. | |
| 2015/0355649 A1 | 12/2015 | Ovadia | |
| 2015/0362927 A1 | 12/2015 | Giorgi | |
| 2016/0012699 A1 | 1/2016 | Lundy | |
| 2016/0018800 A1 | 1/2016 | Gettings et al. | |
| 2016/0035159 A1 | 2/2016 | Ganapathy Achari et al. | |
| 2016/0057841 A1 | 2/2016 | Lenig | |
| 2016/0069933 A1 | 3/2016 | Cook et al. | |
| 2016/0077746 A1 | 3/2016 | Muth et al. | |
| 2016/0081143 A1 | 3/2016 | Wang | |
| 2016/0110154 A1 | 4/2016 | Qureshi et al. | |
| 2016/0117917 A1 | 4/2016 | Prakash et al. | |
| 2016/0126031 A1 | 5/2016 | Wootton et al. | |
| 2016/0178691 A1 | 6/2016 | Simonin | |
| 2016/0181941 A1* | 6/2016 | Gratton | H02M 7/217 363/84 |
| 2016/0195864 A1 | 7/2016 | Kim | |
| 2016/0247799 A1 | 8/2016 | Stafanov et al. | |
| 2016/0259308 A1 | 9/2016 | Fadell et al. | |
| 2016/0260135 A1 | 9/2016 | Zomet et al. | |
| 2016/0277528 A1 | 9/2016 | Guilaume et al. | |
| 2016/0294179 A1 | 10/2016 | Kennedy et al. | |
| 2016/0343083 A1 | 11/2016 | Hering et al. | |
| 2016/0360586 A1 | 12/2016 | Yang et al. | |
| 2016/0374134 A1 | 12/2016 | Kweon et al. | |
| 2017/0004948 A1 | 1/2017 | Leyh | |
| 2017/0019969 A1 | 1/2017 | O'Neil et al. | |
| 2017/0026194 A1 | 1/2017 | Vijayrao et al. | |
| 2017/0033942 A1 | 2/2017 | Koeninger | |
| 2017/0063225 A1* | 3/2017 | Guo | H02M 3/158 |
| 2017/0086281 A1 | 3/2017 | Avrahamy | |
| 2017/0099647 A1 | 4/2017 | Shah et al. | |
| 2017/0170730 A1 | 6/2017 | Sugiura | |
| 2017/0171802 A1 | 6/2017 | Hou et al. | |
| 2017/0179946 A1 | 6/2017 | Turvey | |
| 2017/0195130 A1 | 7/2017 | Landow et al. | |
| 2017/0212653 A1 | 7/2017 | Kanojia et al. | |
| 2017/0230193 A1 | 8/2017 | Apte et al. | |
| 2017/0244241 A1 | 8/2017 | Wilson et al. | |
| 2017/0256934 A1 | 9/2017 | Kennedy et al. | |
| 2017/0256956 A1* | 9/2017 | Irish | H02J 5/00 |
| 2017/0277709 A1 | 9/2017 | Strauss et al. | |
| 2017/0314743 A1 | 11/2017 | Del Castillo et al. | |
| 2017/0322049 A1 | 11/2017 | Wootton et al. | |
| 2017/0322258 A1 | 11/2017 | Miller et al. | |
| 2017/0338809 A1 | 11/2017 | Stefanov et al. | |
| 2017/0347415 A1 | 11/2017 | Cho et al. | |
| 2017/0366950 A1 | 12/2017 | Arbon | |
| 2018/0026534 A1 | 1/2018 | Turcan | |
| 2018/0054862 A1 | 2/2018 | Takagimoto et al. | |
| 2018/0061158 A1 | 3/2018 | Greene | |
| 2018/0146369 A1 | 5/2018 | Kennedy, Jr. | |
| 2018/0174076 A1 | 6/2018 | Fukami | |
| 2018/0196094 A1 | 7/2018 | Fishburn et al. | |
| 2018/0201302 A1 | 7/2018 | Sonoda et al. | |
| 2018/0254959 A1 | 9/2018 | Mantyjarvi et al. | |
| 2018/0285198 A1 | 10/2018 | Dantkale et al. | |
| 2018/0287802 A1 | 10/2018 | Brickell | |
| 2018/0301006 A1 | 10/2018 | Flint et al. | |
| 2018/0307609 A1 | 10/2018 | Qiang et al. | |
| 2018/0342329 A1 | 11/2018 | Rufo et al. | |
| 2018/0359039 A1 | 12/2018 | Daoura et al. | |
| 2018/0359223 A1 | 12/2018 | Maier et al. | |
| 2019/0003855 A1 | 1/2019 | Wootton et al. | |
| 2019/0020477 A1 | 1/2019 | Antonatos et al. | |
| 2019/0028869 A1 | 1/2019 | Kaliner | |
| 2019/0036928 A1 | 1/2019 | Meriac et al. | |
| 2019/0050903 A1 | 2/2019 | DeWitt et al. | |
| 2019/0052174 A1* | 2/2019 | Gong | G05F 1/575 |
| 2019/0068716 A1 | 2/2019 | Lauer | |
| 2019/0086979 A1 | 3/2019 | Kao et al. | |
| 2019/0087835 A1 | 3/2019 | Schwed et al. | |
| 2019/0104138 A1 | 4/2019 | Storms et al. | |
| 2019/0140640 A1 | 5/2019 | Telefus et al. | |
| 2019/0165691 A1 | 5/2019 | Telefus et al. | |
| 2019/0207375 A1 | 7/2019 | Telefus et al. | |
| 2019/0238060 A1* | 8/2019 | Telefus | H02M 1/08 |
| 2019/0245457 A1 | 8/2019 | Telefus et al. | |
| 2019/0253243 A1 | 8/2019 | Zimmerman et al. | |
| 2019/0268176 A1 | 8/2019 | Pognant | |

(56) References Cited

U.S. PATENT DOCUMENTS

| | | |
|---|---|---|
| 2019/0280887 A1 | 9/2019 | Telefus et al. |
| 2019/0306953 A1 | 10/2019 | Joyce et al. |
| 2019/0334999 A1 | 10/2019 | Ryhorchuk et al. |
| 2019/0355014 A1 | 11/2019 | Gerber |
| 2019/0372331 A1* | 12/2019 | Liu .................... H02J 7/00308 |
| 2020/0007126 A1 | 1/2020 | Telefus et al. |
| 2020/0014301 A1 | 1/2020 | Telefus |
| 2020/0014379 A1 | 1/2020 | Telefus |
| 2020/0044883 A1 | 2/2020 | Telefus et al. |
| 2020/0052607 A1 | 2/2020 | Telefus et al. |
| 2020/0053100 A1 | 2/2020 | Jakobsson |
| 2020/0106259 A1 | 4/2020 | Telefus |
| 2020/0106260 A1 | 4/2020 | Telefus |
| 2020/0106637 A1 | 4/2020 | Jakobsson |
| 2020/0120202 A1 | 4/2020 | Jakobsson et al. |
| 2020/0145247 A1 | 5/2020 | Jakobsson |
| 2020/0153245 A1 | 5/2020 | Jakobsson et al. |
| 2020/0159960 A1 | 5/2020 | Jakobsson |
| 2020/0193785 A1 | 6/2020 | Berglund et al. |
| 2020/0196110 A1 | 6/2020 | Jakobsson |
| 2020/0196412 A1 | 6/2020 | Telefus et al. |
| 2020/0260287 A1 | 8/2020 | Hendel |
| 2020/0275266 A1 | 8/2020 | Jakobsson |
| 2020/0287537 A1 | 9/2020 | Telefus et al. |
| 2020/0314233 A1 | 10/2020 | Mohalik et al. |
| 2020/0328694 A1 | 10/2020 | Telefus et al. |
| 2020/0344596 A1 | 10/2020 | Dong et al. |
| 2020/0365345 A1 | 11/2020 | Telefus et al. |
| 2020/0365346 A1 | 11/2020 | Telefus et al. |
| 2020/0365356 A1 | 11/2020 | Telefus et al. |
| 2020/0366078 A1 | 11/2020 | Telefus et al. |
| 2020/0366079 A1 | 11/2020 | Telefus et al. |
| 2020/0394332 A1 | 12/2020 | Jakobsson et al. |

FOREIGN PATENT DOCUMENTS

| | | |
|---|---|---|
| EP | 2560063 A1 | 2/2013 |
| GB | 2458699 A | 9/2009 |
| JP | 06-053779 A | 2/1994 |
| JP | 2013230034 A | 11/2013 |
| JP | 2014030355 A | 2/2014 |
| WO | 2010110951 A1 | 9/2010 |
| WO | 2016010529 A1 | 1/2016 |
| WO | 2016110833 A2 | 7/2016 |
| WO | 2017196571 A1 | 11/2017 |
| WO | 2017196572 A1 | 11/2017 |
| WO | 2017196649 A1 | 11/2017 |
| WO | 2018075726 A1 | 4/2018 |
| WO | 2018080604 A1 | 5/2018 |
| WO | 2018080614 A1 | 5/2018 |
| WO | 2018081619 A2 | 5/2018 |
| WO | 2018081619 A3 | 5/2018 |
| WO | 2019133110 A1 | 7/2019 |
| WO | 2020014158 A1 | 1/2020 |
| WO | 2020014161 A1 | 1/2020 |
| WO | PCT/US19/54102 | 2/2020 |
| WO | 2020072516 A1 | 4/2020 |
| WO | PCT/US19/67004 | 4/2020 |
| WO | 2020131977 A1 | 6/2020 |
| WO | PCT/US20/33421 | 9/2020 |
| WO | 2020236726 A1 | 11/2020 |

OTHER PUBLICATIONS

U.S. Appl. No. 17/032,759 filed in the name of Mark D. Telefus et al. filed Sep. 25, 2020, and entitled "AC-Driven Light-Emitting Diode Systems."

U.S. Appl. No. 17/047,613 filed in the name of Mark Telefus et al. filed Oct. 14, 2020, and entitled "Intelligent Circuit Breakers."

U.S. Appl. No. 17/115,753 filed in the name of Mark Telefus filed Dec. 8, 2020, and entitled "Solid-State Power Interrupters."

U.S. Appl. No. 62/963,230 filed in the name of Bjorn Markus Jakobsson filed Jan. 20, 2020, and entitled "Infrastructure Support to Enhance Resource-Constrained Device Capabilities."

U.S. Appl. No. 62/964,078 filed in the name of Mark Telefus et al. filed Jan. 21, 2020, and entitled "Intelligent Power Receptacle with Arc Fault Circuit Interruption."

U.S. Appl. No. 63/064,399 filed in the name of Mark Telefus et al. filed Aug. 11, 2020, and entitled "Energy Traffic Monitoring and Control System."

F. Stajano et al., "The Resurrecting Duckling: Security Issues for Ad-hoc Wireless Networks," International Workshop on Security Protocols, 1999, 11 pages.

L. Sweeney, "Simple Demographics Often Identify People Uniquely," Carnegie Mellon University, Data Privacy Working Paper 3, 2000, 34 pages.

A. Narayanan et al., "Robust De-anonymization of Large Sparse Datasets," IEEE Symposium on Security and Privacy, May 2008, 15 pages.

M. Alahmad et al., "Non-Intrusive Electrical Load Monitoring and Profiling Methods for Applications in Energy Management Systems," IEEE Long Island Systems, Applications and Technology Conference, 2011, 7 pages.

K. Yang et al. "Series Arc Fault Detection Algorithm Based on Autoregressive Bispecturm Analysis," Algorithms, vol. 8, Oct. 16, 2015, pp. 929-950.

J.-E. Park et al., "Design on Topologies for High Efficiency Two-Stage AC-DC Converter," 2012 IEEE 7th International Power Electronics and Motion Control Conference—ECCE Asia, Jun. 2-5, 2012, China, 6 pages.

S. Cuk, "98% Efficient Single-Stage AC/DC Converter Topologies," Power Electronics Europe, Issue 4, 2011, 6 pages.

E. Carvou et al., "Electrical Arc Characterization for Ac-Arc Fault Applications," 2009 Proceedings of the 55th IEEE Holm Conference on Electrical Contacts, IEEE Explore Oct. 9, 2009, 6 pages.

C. Restrepo, "Arc Fault Detection and Discrimination Methods," 2007 Proceedings of the 53rd IEEE Holm Conference on Electrical Contacts, IEEE Explore Sep. 24, 2007, 8 pages.

K. Eguchi et al., "Design of a Charge-Pump Type AC-DC Converter for RF-ID Tags," 2006 International Symposium on Communications and Information Technologies, F4D-3, IEEE, 2006, 4 pages.

A. Ayari et al., "Active Power Measurement Comparison Between Analog and Digital Methods," International Conference on Electrical Engineering and Software Applications, 2013, 6 pages.

G. D. Gregory et al., "The Arc-Fault Circuit Interrupter, an Emerging Product," IEEE, 1998, 8 pages.

D. Irwin et al., "Exploiting Home Automation Protocols for Load Monitoring in Smart Buildings," BuildSys '11: Proceedings of the Third ACM Workshop on Embedded Sensing Systems for Energy-Efficiency in Buildings, Nov. 2011, 6 pages.

B. Mrazovac et al., "Towards Ubiquitous Smart Outlets for Safety and Energetic Efficiency of Home Electric Appliances," 2011 IEEE International Conference on Consumer Electronics, Berlin, German, Sep. 6-8, 2011, 5 pages.

J. K. Becker et al., "Tracking Anonymized Bluetooth Devices," Proceedings on Privacy Enhancing Technologies, vol. 3, 2019, pp. 50-65.

H. Siadati et al., "Mind your SMSes: Mitigating Social Engineering in Second Factor Authentication," Computers & Security, vol. 65, Mar. 2017, 12 pages.

S. Jerde, "The New York Times Can Now Predict Your Emotions and Motivations After Reading a Story," https://www.adweek.com/tv-video/the-new-york-times-can-now-predict-your-emotions-and-motivations-after-reading-a-story/, Apr. 29, 2019, 3 pages.

K. Mowery et al., "Pixel Perfect: Fingerprinting Canvas in HTML5," Proceedings of W2SP, 2012, 12 pages.

S. Kamkar, "Evercookie," https://samy.pl/evercookie/, Oct. 11, 2010, 5 pages.

M. K. Franklin et al., "Fair Exchange with a Semi-Trusted Third Party," Association for Computing Machinery, 1997, 6 pages.

J. Camenisch et al., "Digital Payment Systems with Passive Anonymity-Revoking Trustees," Journal of Computer Security, vol. 5, No. 1, 1997, 11 pages.

(56) References Cited

OTHER PUBLICATIONS

L. Coney et al., "Towards a Privacy Measurement Criterion for Voting Systems," Proceedings of the 2005 National Conference on Digital Government Research, 2005, 2 pages.

L. Sweeney, "κ-anonymity: A Model for Protecting Privacy," International Journal of Uncertainty, Fuzziness and Knowledge-Based Systems, vol. 1, No. 5, 2002, 14 pages.

C. Dwork, "Differential Privacy," Encyclopedia of Cryptography and Security, 2011, 12 pages.

A. P. Felt et al., "Android Permissions: User Attention, Comprehension, and Behavior," Symposium on Usable Privacy and Security, Jul. 11-13, 2012, 14 pages.

S. Von Solms et al., "On Blind Signatures and Perfect Crimes," Computers & Security, vol. 11, No. 6, 1992, 3 pages.

R. Wyden, "Wyden Releases Discussion Draft of Legislation to Provide Real Protections for Americans' Privacy," https://www.wyden.senate.gov/news/press-releases/wyden-releases-discussion-draft-of-legislation-to-provide-real-protections-for-americans-privacy, Nov. 1, 2018, 3 pages.

M. Rubio, "Rubio Introduces Privacy Bill to Protect Consumers While Promoting Innovation," https://www.rubio.senate.gov/public/index.cfm/2019/1/rubio-introduces-privacy-bill-to-protect-consumers-while-promoting-innovation#:%7E:text=Washingt%E2%80%A6, Jan. 16, 2019, 2 pages.

C. Dwork et al., "Differential Privacy and Robust Statistics," 41st ACM Symposium on Theory of Computing, 2009, 10 pages.

J. Camenisch et al., "Compact E-Cash," Eurocrypt, vol. 3494, 2005, pp. 302-321.

D. L. Chaum, "Untraceable Electronic Mail, Return Addresses, and Digital Pseudonyms," Communications of the ACM, vol. 24, No. 2, Feb. 1981, pp. 84-88.

J. Camenisch et al., "An Efficient System for Nontransferable Anonymous Credentials With Optional Anonymity Revocation," International Conference on the Theory and Application of Cryptographic Techniques, May 6-10, 2001, 30 pages.

M. K. Reiter et al., "Crowds: Anonymity for Web Transactions," ACM Transactions on Information and System Security, vol. 1, 1997, 23 pages.

I. Clarke et al., "Freenet: A Distributed Anonymous Information Storage and Retrieval System," International Workshop on Designing Privacy Enhanching Technologies: Design Issues in Anonymity and Unobservability, 2001, 21 pages.

P. Golle et al., "Universal Re-encryption for Mixnets," Lecture Notes in Computer Science, Feb. 2004, 15 pages.

Y. Lindell et al., "Multiparty Computation for Privacy Preserving Data Mining," Journal of Privacy and Confidentiality, May 6, 2008, 39 pages.

J. Hollan et al., "Distributed Cognition: Toward a New Foundation for Human-Computer Interaction Research," ACM Transactions on Computer-Human Interaction, vol. 7, No. 2, Jun. 2000, pp. 174-196.

A. Adams et al., "Users are Not the Enemy," Communications of the ACM, Dec. 1999, 6 pages.

A. Morton et al., "Privacy is a Process, Not a Pet: a Theory for Effective Privacy Practice," Proceedings of the 2012 New Security Paradigms Workshop, Sep. 2012, 18 pages.

G. D. Abowd et al., "Charting Past, Present and Future Research in Ubiquitous Computing," ACM Transactions on Computer-Human Interaction, vol. 7, No. 1, Mar. 2000, pp. 29-58.

W. Mason et al., "Conducting Behavioral Research on Amazon's Mechanical Turk," Behavior Research Methods, Jun. 2011, 23 pages.

G. M. Gray et al., "Dealing with the Dangers of Fear: The Role of Risk Communication," Health Affairs, Nov. 2002, 11 pages.

L. Shengyuan et al., "Instantaneous Value Sampling AC-DC Converter and its Application in Power Quantity Detection," 2011 Third International Conference on Measuring Technology and Mechatronics Automation, Jan. 6-7, 2011, 4 pages.

H.-H. Chang et al., "Load Recognition for Different Loads with the Same Real Power and Reactive Power in a Non-Intrusive Load-monitoring System," 2008 12th International Conference on Computer Supported Cooperative Work in Design, Apr. 16-18, 2008, 6 pages.

\* cited by examiner

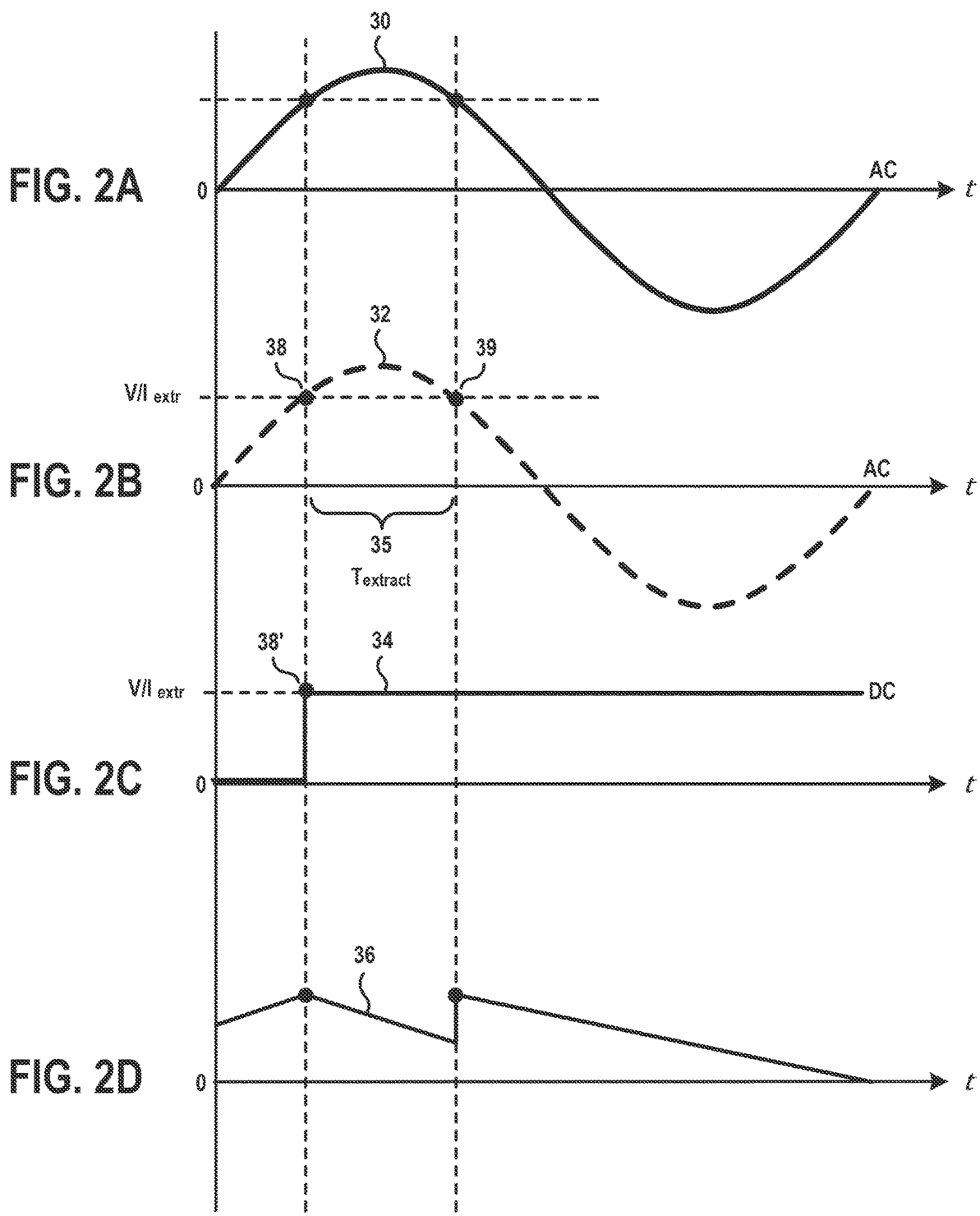

METHOD AND APPARATUS FOR SIGNAL EXTRACTION WITH SAMPLE AND HOLD AND RELEASE

FIELD OF INVENTION

The invention pertains generally to the field of electronic signal processing, particularly for AC to DC conversion via signal extraction and sample and hold and release.

BACKGROUND OF INVENTION

Conventional approaches for AC to DC conversion employ various analog circuitry to achieve AC-DC conversion. However, such approaches undesirably require many circuit components that may cause signal processing delay, inaccuracy, and/or overall cost to implement. There is need therefore to provide simpler approach for AC to DC signal conversion.

SUMMARY

AC-DC signal conversion is achieved by extracting a signal from an AC signal during certain extraction time cycle, then sampling and holding and releasing the extracted signal to generate a DC signal. Extraction element receives AC signal to generate extracted signal, then sample and hold and release element receives the extracted signal to generate DC signal. Extraction and/or sample and hold and release signal processing may use microprocessor or controller programmably to generate the extracted signal and/or DC signal. Extraction is configurable such that AC signal is received at extraction time or temporal window, whereby said extraction element generates the extracted signal at an extraction current or voltage value during at least one extraction time, and preferably said sample and hold and release element generates the DC signal having the same extraction current or voltage value.

BRIEF DESCRIPTION OF FIGURES

FIGS. 2A-D illustrate representative signal timing charts for signal extraction and sample and hold and release according to one or more aspect of the present invention.

DETAILED DESCRIPTION

AC to DC signal conversion is accomplished generally by extracting from input AC or other sinusoidal signal source to generate an extracted signal, upon which a sample and hold and release functions are applied to the extracted signal to generate an output DC signal. Preferably an extraction element receives the AC signal electronically to generate the extracted signal, whereupon sample and hold and release elements receive the extracted signal electronically to generate DC signal. Extraction and/or sample and hold and release signal processing may use microprocessor, controller or other programmable device to generate the extracted signal and/or DC signal. Extraction is configurable electronically such that AC signal is received or otherwise measured at pre-determined extraction time or temporal window, whereby said extraction element generates the extracted signal having an extraction current and/or voltage value during at least one extraction time, and preferably said sample and hold and release element generates the DC signal having the same extraction current and/or voltage value.

Figure 1A:
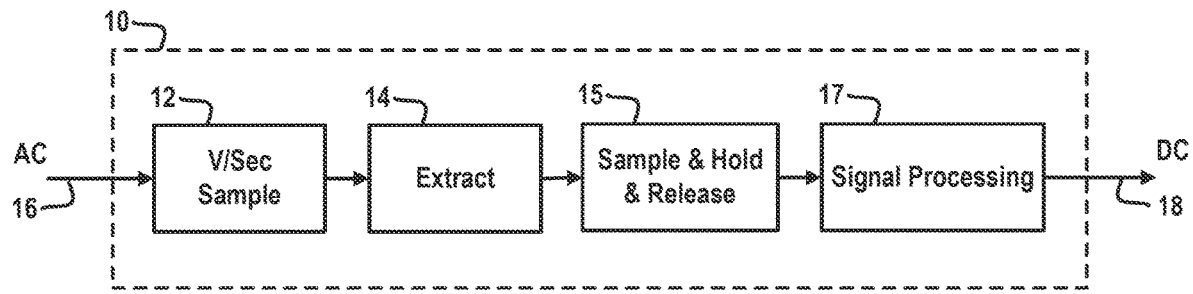
FIG. 1A illustrates representative apparatus embodiment diagram for signal extraction and sample and hold and release according to one or more aspect of the present invention.
Figure 1B:
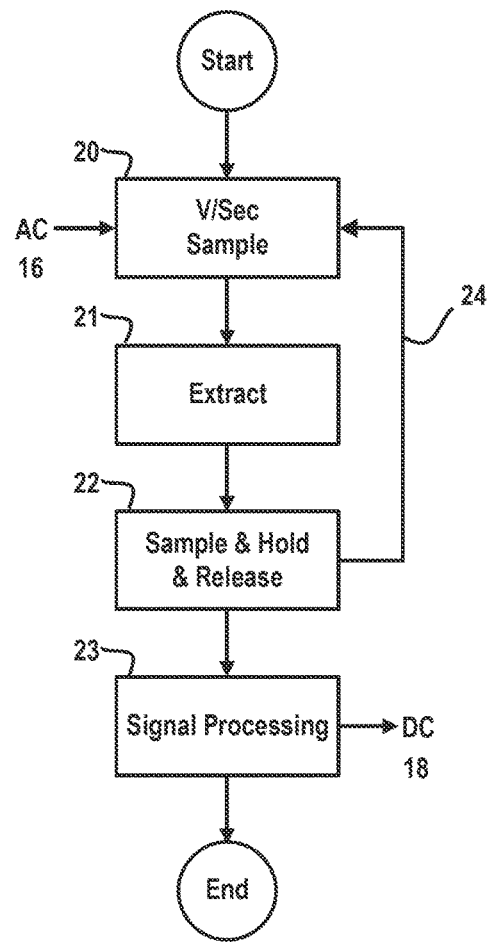
FIG. 1B illustrates representative method flow chart for signal extraction and sample and hold and release steps according to one or more aspect of the present invention.

FIG. 1A shows simplified diagram for signal extraction and sample and hold device 10, having voltage per second (V/sec) sampling element 12, extraction element 14 and sample and hold and release element 15, which receives AC signal 16 and generates DC signal 18. FIG. 1B shows simplified flow chart for V/sec sampling 20, signal extraction 21, sample and hold and release 22 step, and signal processing 23. whereby as shown AC signal 16 is received, and DC signal 18 is generated. Generally, it is contemplated herein that V/sec sampling occurs via voltage or current amplitude or time domain, for example, applicable on various time zone over AC main cycles, preferably starting at time zero.

FIGS. 2A-D show signal timing charts for signal extraction and sample and hold and release. Initially when operating AC signal 30 is received or otherwise detected by device 10 electronically as one or more sinusoidal, or other alternating current and/or voltage signal. AC signal 30 is preferably provided by an external power supply or other electrical source (not shown) that generates AC voltage and/or current signal relative to ground according to one or more standard or conventional electrical signaling protocol.

In accordance with one or more aspect of preferred embodiment, such AC signal 30, 32 is detected or otherwise processed electronically for signal extraction by V/sec sampling 12, 20 at one or more determined or pre-determined extraction time (Textract) 35 to generate by extracting 14, 21 extracted signal 38, 39. In particular, extracted signal 38, 39 corresponds with extracted voltage and/or current value (V/Iextr) determined at certain extraction time (Textract), as determined electronically by extraction device 14, 21 or other functionally equivalent extraction means. Preferably no sampling or extraction occurs between extraction or sampling times 38, 39 as shown; since sampling and extraction occurs twice per periodic cycle of AC signal 30, 32. Thus, this extraction sampling release approach advantageously conserves electrical energy by significantly reducing or otherwise eliminating continuous AC-DC signal conversion between signal times 38, 39.

Moreover, sample and hold and release element 15, 22 receives the extracted signal 38', and thereby generates a sampled and held and released DC signal 34 having the same extracted voltage and/or current value V/Iextr. Thus, for example, starting at t=0 device 10 generates increasingly to generate sampled and held and released DC signal 34 preferably until reaching target voltage or current (V/Iextr), then released or otherwise disconnected at signal time 38 until next signal time 39. Generally it is contemplated herein that signal sampling hold and release enables signal generation of data information, for example, as extracted signal information via voltage level and/or current carry.

In particular, as shown in FIG. 2D, DC signal 34 may be generated using regulator circuit as sawtooth output signal 36, showing such signal charging voltage increasingly up to signal time 38, 38', then capacitively discharging until signal time 39, when output signal 36 recharges and again discharges as shown.

Optionally device 10 uses microprocessor, signal processor, or other digital controller automatically to perform signal extraction, and/or sample and hold and release. This optional approach enables other data or signal processing 17, 22 coupled to device 10. Generally it is contemplated herein that such processor or controller may be embodied in any programmable or controllable circuit or logic element, such as simple transistor, comparator, digital gate, or other signal processing circuit.

Figure 3:
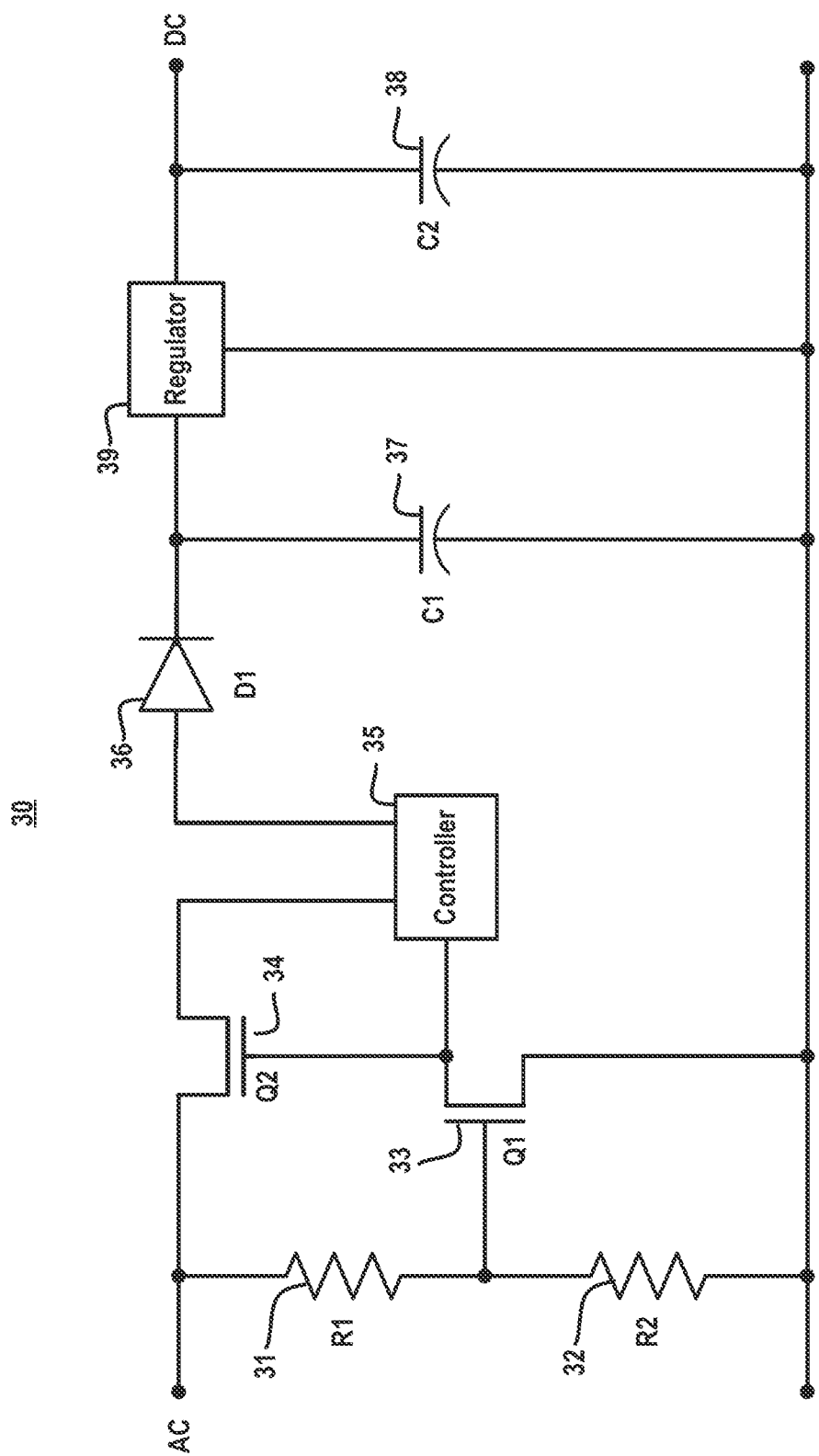
FIG. 3 illustrates representative apparatus embodiment diagrams for signal extraction and sample and hold and release according to one or more aspect of the present invention.

FIG. 3 illustrates circuit 30 for signal extraction and sample and hold and release for converting AC to DC signal. As shown, AC signal is received by resistor 31 coupled to resistor 32 and transistor 33, and transistor 34, further coupled to controller 35, coupled to diode 36, which couples to capacitor 37 and regulator 39, coupled to capacitor 38.

Foregoing descriptions of specific embodiments of the invention have been presented for purposes of illustration and description. They are not intended to be exhaustive or to limit the invention to the precise forms disclosed. Modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

The invention claimed is:

1. A converter circuit, comprising:
   a first input node and a second input node, the first and second input nodes being configured to receive an input alternating current (AC) signal;
   a sample and hold circuit coupled to the first and second input nodes and configured to receive as input positive and negative half cycles of the AC signal;
   a capacitor comprising a first terminal coupled to an output node of the sample and hold circuit, and a second terminal coupled to the second input node; and
   a regulator circuit comprising an input coupled to the first terminal of the capacitor, and an output coupled to a first output node of the converter circuit;
   wherein the sample and hold circuit is further configured to:
   (i) couple the first input node of the converter circuit to the first terminal of the capacitor and to the input of the regulator circuit during a first portion and a second portion of each positive half cycle of the input AC signal to thereby utilize the input AC signal as a power source to charge the capacitor and for the regulator circuit to generate a direct current (DC) signal which is output on the first output node of the converter circuit; and
   (ii) decouple the first input node of the converter circuit from the first terminal of the capacitor and from the input of the regulator circuit during a third portion of each positive half cycle of the input AC signal, and during an entirety of each negative half cycle of the input AC signal, to thereby utilize the charged capacitor as an input voltage source to the input of the regulator circuit to maintain the output DC signal on the first output node of the converter circuit.

2. The converter circuit of claim 1, wherein the sample and hold circuit comprises:
   a voltage divider circuit comprising a first resistor and a second resistor serially coupled between the first and second input nodes of the converter circuit;
   a first transistor;
   a second transistor; and
   a diode;
   wherein the first transistor comprises a gate terminal coupled to a node between the first and second resistors of the voltage divider circuit, a first source/drain terminal coupled to a gate terminal of the second transistor, and a second source/drain terminal coupled to the second input node of the converter circuit;
   wherein the second transistor comprises a first source/drain terminal coupled to the first input node of the converter circuit, and a second source/drain terminal coupled to an anode of the diode; and
   wherein a cathode of the diode is coupled to the first terminal of the capacitor and to the input of the regulator circuit.

3. The converter circuit of claim 2, wherein the sample and hold circuit is configured to (i) deactivate the first transistor during the first and second portions of each positive half cycle of the input AC signal and during the entirety of each negative half cycle of the input AC signal, (ii) activate the first transistor during the third portion of each positive half cycle of the input AC signal, (iii) activate the second transistor during the first and second portions of each positive half cycle of the input AC signal and during the entirety of each negative half cycle of the input AC signal, and (iv) deactivate the second transistor during the third portion of each positive half cycle of the input AC signal.

4. The converter circuit of claim 2, further comprising a controller which is coupled between the second source/drain terminal of the second transistor and the anode of the diode.

5. The converter circuit of claim 4, wherein the controller is further coupled to the gate terminal of the second transistor and to the first source/drain terminal of the first transistor.

6. The converter circuit of claim 1, further comprising a second output node which comprises the second input node of the converter circuit.

7. The converter circuit of claim 1, further comprising a second capacitor comprising a first terminal coupled to the output of the regulator circuit and to the first output node, and a second terminal coupled to a second output node of the converter circuit.

8. The converter circuit of claim 1, wherein the third portion of each positive half cycle of the AC signal comprises a peak voltage of the AC signal, and is between the first and second portions of the positive half cycle.

9. The converter circuit of claim 1, wherein the coupling and decoupling of the first input node of the converter circuit to the first terminal of the capacitor causes a charging and discharging of the capacitor and generation of a sawtooth voltage waveform that is applied to the input of the regulator circuit.

10. A method comprising:
    receiving, by a sample and hold circuit, positive and negative half cycles of an input alternating current (AC) signal on first and second input nodes;
    coupling, by the sample and hold circuit, the first input node to a terminal of a capacitor and to an input of regulator circuit during a first portion and a second portion of each positive half cycle of the input AC signal to thereby utilize the input AC signal as a power source to charge the capacitor and for the regulator circuit to generate an output direct current (DC) signal; and decoupling, by the sample and hold circuit, the first input node from the terminal of the capacitor and from the input of the regulator circuit during a third portion of each positive half cycle of the input AC signal, and during an entirety of each negative half cycle of the input AC signal, to thereby utilize the charged capacitor as an input voltage source to the input of the regulator circuit to maintain the output DC signal.

11. The method of claim 10, wherein the third portion of each positive half cycle of the AC signal comprises a peak voltage of the AC signal, and is between the first and second portions of the positive half cycle.

12. The method of claim 10, wherein the coupling and decoupling of the first input node to the terminal of the capacitor causes a charging and discharging of the capacitor and generation of a sawtooth voltage waveform that is applied to the input of the regulator circuit.

* * * * *